(12) United States Patent
Liu

(10) Patent No.: US 10,355,026 B2
(45) Date of Patent: Jul. 16, 2019

(54) METHOD FOR MANUFACTURING METAL WIRE AND ARRAY SUBSTRATE USING THE SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xiang Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/575,714

(22) PCT Filed: Nov. 1, 2017

(86) PCT No.: PCT/CN2017/108856
§ 371 (c)(1),
(2) Date: Nov. 20, 2017

(87) PCT Pub. No.: WO2018/233180
PCT Pub. Date: Dec. 27, 2018

(65) Prior Publication Data
US 2018/0374878 A1    Dec. 27, 2018

(30) Foreign Application Priority Data
Jun. 22, 2017   (CN) .......................... 2017 1 0479326

(51) Int. Cl.
*H01L 27/12*    (2006.01)
*H01L 21/3213*  (2006.01)
*H01L 21/311*   (2006.01)

(52) U.S. Cl.
CPC .... *H01L 27/1244* (2013.01); *H01L 21/32139* (2013.01); *H01L 27/1262* (2013.01);
(Continued)

(58) Field of Classification Search
CPC ............. H01L 27/1244; H01L 27/1262; H01L 21/31144; H01L 27/124; H01L 27/3248; H01L 27/326; H01L 27/426
(Continued)

(56) References Cited

U.S. PATENT DOCUMENTS

2016/0064415 A1* 3/2016 Zhan ..................... H01L 27/124
257/72

FOREIGN PATENT DOCUMENTS

| CN | 104392991 A | 3/2015 |
|---|---|---|
| CN | 106057824 A | 10/2016 |
| CN | 106647077 A | 5/2017 |

* cited by examiner

*Primary Examiner* — Thinh T Nguyen
(74) *Attorney, Agent, or Firm* — Kirton McConkie; Evan R. Witt

(57) ABSTRACT

A method for manufacturing a metal wire and an array substrate includes the steps of forming a metal layer, an insulating layer, and a photoresist on the substrate sequentially; exposing the photoresist to form a photoresist retention region and a photoresist non-retention region; developing the photoresist non-retention region; etching the insulating layer to expose a region of the metal layer to be etched; and etching the metal layer to remove portions not covered by the photoresist retention region to form a metal wire.

12 Claims, 3 Drawing Sheets

(52) U.S. Cl.
CPC ............... *H01L 21/31144* (2013.01); *H01L 2924/01013* (2013.01); *H01L 2924/01079* (2013.01)

(58) Field of Classification Search
USPC ............... 438/118, 622; 257/734, 750, 72
See application file for complete search history.

METHOD FOR MANUFACTURING METAL WIRE AND ARRAY SUBSTRATE USING THE SAME

FIELD OF THE INVENTION

This disclosure relates to display technology, and more particularly to a method for manufacturing a metal wire and an array substrate using the same.

BACKGROUND OF THE INVENTION

With the continuous increase in quality requirements of liquid crystal displays, high resolution liquid crystal displays are trending. In order to enhance resolution of the liquid crystal displays, it is necessary to make width of metal wires (such as data lines) much narrower, which also has higher production requirements.

In conventional production process, a size of a photoresist, generally controlled by the photoresist after exposure and development to the photoresist, is used as a size of the metal wire. However, with the width requirements of the metal wire needing to be narrower, and the photoresist denatured easily as the photoresist is in contact with the etching solution during the etching process, which leads the photoresist to tilt. Thus, an etching solution will flow along a gap between the photoresist thereinto, and then corrode the metal wire under the photoresist. This causes the metal wire to break.

Thus, it is necessary to provide a method for manufacturing a metal wire and an array substrate to solve the problems of the prior art.

SUMMARY OF THE INVENTION

The object of this disclosure is to provide a method for manufacturing a metal wire and an array substrate for preventing the metal line breakage while the width of the wire is reduced, thereby improving product yield.

This disclosure provides a method for manufacturing a metal wire, which comprises steps of:
 forming a metal layer on a substrate;
 forming an insulating layer on the metal layer;
 coating a photoresist on the insulating layer;
 exposing the photoresist to form a photoresist retention region and a photoresist non-retention region;
 developing the photoresist non-retention region, and removing the photoresist non-retaining region to expose a region of the insulating layer to be etched;
 etching the insulating layer to remove portions of the insulating layer not covered by the photoresist retention region to expose a region of the metal layer to be etched; and
 etching the metal layer to remove portions of the the metal layer not covered by the photoresist retention region to form a metal wire;
 wherein the insulating layer is made of oxides, nitrides, or nitroxides; and
 wherein the step of etching the metal layer on the photoresist non-retained region further comprises:
 ashing the photoresist on the photoresist retained region to remove the photoresist on the photoresist retained region.

In the method for manufacturing the metal wire of this disclosure, the metal layer is a source-drain metal layer, and the photoresist retention region includes: a region corresponding to a subsequently formed data line, and a region corresponding to a source and a drain.

In the method for manufacturing the metal wire of this disclosure, oxygen is supplied in the step of ashing the photoresist on the photoresist retained region.

In the method for manufacturing the metal wire of this disclosure, the metal wire is a data line or a common electrode line.

This disclosure further provides a method for manufacturing a metal wire, which comprises steps of:
 forming a metal layer on a substrate;
 forming an insulating layer on the metal layer;
 coating a photoresist on the insulating layer;
 exposing the photoresist to form a photoresist retention region and a photoresist non-retention region;
 developing the photoresist non-retention region, and removing the photoresist non-retaining region to expose a region of the insulating layer to be etched;
 etching the insulating layer to remove portions of the insulating layer not covered by the photoresist retention region to expose a region of the metal layer to be etched; and
 etching the metal layer to remove portions of the metal layer not covered by the photoresist retention region to form a metal wire.

In the method for manufacturing the metal wire of this disclosure, the insulating layer is made of oxides, nitrides or nitroxides.

In the method for manufacturing the metal wire of this disclosure, the metal layer is a source-drain metal layer, and the photoresist retention region includes a region corresponding to a data line subsequently formed and a region corresponding to a source and a drain.

In the method for manufacturing the metal wire of this disclosure, the step of etching the metal layer on the photoresist non-retained region further comprises:
 ashing the photoresist on the photoresist retained region to remove the photoresist on the photoresist retained region.

In the method for manufacturing the metal wire of this disclosure, oxygen is supplied in the step of ashing the photoresist on the photoresist retained region.

In the method for manufacturing the metal wire of this disclosure, the metal wire is a data line or a common electrode line.

An objective of this disclosure is to further provide an array substrate, which comprises a substrate and a metal wire disposed on the substrate. The metal wire is covered with an insulating layer to protect the metal wire from corrosion.

In the array substrate of this disclosure, the insulating layer is made of oxides, nitrides, or nitroxides.

In the array substrate of this disclosure, the metal layer is a source-drain metal layer, and the photoresist retention region includes: a region corresponding to a subsequently formed data line, and a region corresponding to a source and a drain.

In the array substrate of this disclosure, the metal wire is a data line or a common electrode line.

This disclosure relates to the method for manufacturing the metal wire and the array substrate. An insulating layer is formed between the metal layer and the photoresist so that the insulating layer has a good adhesion to the metal layer. Thus, when the metal layer is etched, the metal wire will not break due to the tilted photoresist. That can prevent the metal line from being broken while the width of the wire is reduced, thereby improving product yield.

The preferred embodiments adopted by this disclosure are given in the following detailed description, with reference to the drawings.

DESCRIPTION OF THE DRAWINGS

To make the above embodiments of this disclosure more comprehensible, the preferred embodiments being adopted by this disclosure to achieve the above and other objectives can be best understood by referring to the following detailed description of the preferred embodiments and the accompanying drawings as detailed below.

DETAILED DESCRIPTION OF THE PREFERRED EMBODIMENTS

In order to more clearly describe the embodiments of this disclosure or the conventional technical solutions, the description is used to make a simple introduction of the drawings used in the following embodiments. The following description of the drawings are merely some embodiments of this disclosure, those of ordinary skill in the art can also obtain other drawings based on these drawings without creative effort.

Figure 1:
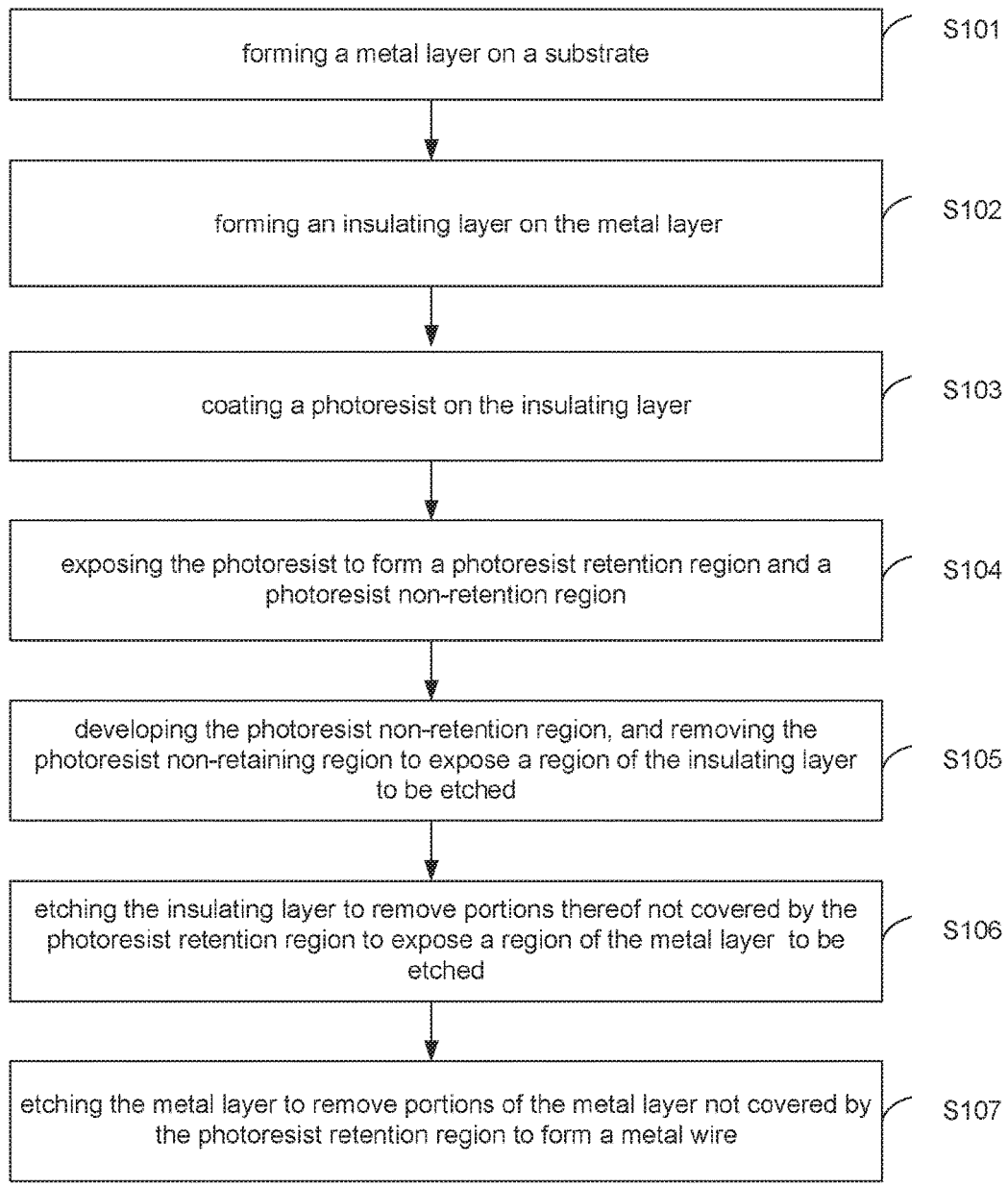
FIG. 1 is a flowchart of a method for manufacturing a metal wire according to a preferred embodiment of this disclosure.

Referring to FIG. 1, a flowchart of a method for manufacturing a metal wire according to a preferred embodiment of this disclosure is shown. As shown in FIG. 1, the preferred embodiment provides a method for manufacturing a metal wire, which comprises steps of:

In a step S101, forming a metal layer on a substrate;

In a step S102, forming an insulating layer on the metal layer;

In a step S103, coating a photoresist on the insulating layer;

In a step S104, exposing the photoresist to form a photoresist retention region and a photoresist non-retention region;

In a step S105, developing the photoresist non-retention region, and removing the photoresist non-retaining region to expose a region of the insulating layer to be etched;

In a step S106, etching the insulating layer to remove portions of the insulating layer not covered by the photoresist retention region to expose a region of the metal layer to be etched; and In a step S107, etching the metal layer to remove portions of the metal layer not covered by the photoresist retention region to form a metal wire.

First of all, it should be noted that the method for manufacturing the metal wire is part of the fabrication process of the array substrate. The manufacturing method of the other parts of the array substrate, such as a common electrode, a pixel electrode, a gate wire, and the like, is not the focus of this disclosure, and is not described in detail herein.

In the preferred embodiment, the metal wire is a data line, a common electrode line, and the like. The method of this disclosure will be described in detail with reference to the production of data lines.

Figure 2:
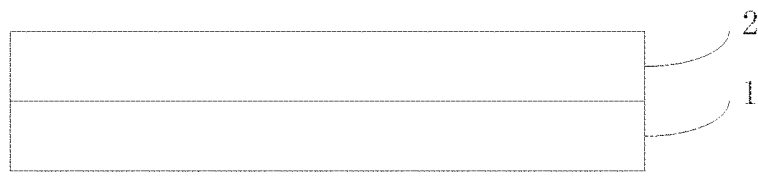
FIG. 2 is a structural schematic view of an array substrate in the process of the method for manufacturing the metal wire according to the first preferred embodiment of this disclosure.

Referring to FIG. 2, a structural schematic view of an array substrate in the process of the method for manufacturing the metal wire according to the first preferred embodiment of this disclosure is shown. As shown in FIG. 2, when it is necessary to manufacture a data line, the metal layer to be formed may be a source-drain metal layer 1.

The source-drain metal layer 1 is formed on a gate insulating layer 2. In addition, when the laminated structure of the array substrate is changed, the source-drain metal layer 1 can be formed on the other laminated structure as necessary, and this disclosure is not limited thereto.

Figure 3:
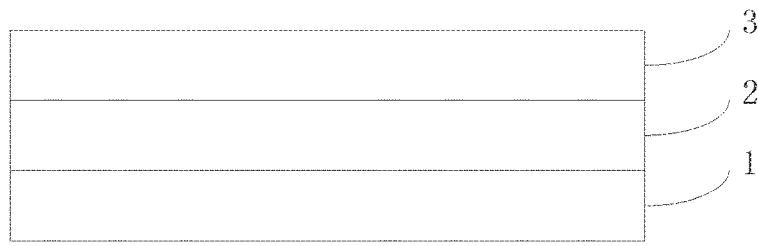
FIG. 3 is a structural schematic view of the array substrate in the process of the method for manufacturing the metal wire according to the second preferred embodiment of this disclosure.

Referring to FIG. 3, a structural schematic view of the array substrate in the process of the method for manufacturing the metal wire according to the second preferred embodiment of this disclosure is shown. As shown in FIG. 3, after forming the source-drain metal layer 2, an insulating layer 3 is formed on the source-drain metal layer 2 for covering the source-drain metal layer 2. It should be noted that the insulating layer 3 is used to protect a subsequently formed data line for preventing the data line from being broken due to deformation and tilt of the photoresist.

In particular, the surface of the insulating layer 3 is flattened so as to be closely adhered to the photoresist when the photoresist is subsequently coated on the insulating layer 3. Preferably, the insulating layer is made of oxides, nitrides, or nitroxides.

Figure 4:
FIG. 4 is a structural schematic view of the array substrate in the process of the method for manufacturing the metal wire according to the third preferred embodiment of this disclosure.

Referring to FIG. 4, which is a structural schematic view of the array substrate in the process of the method for manufacturing the metal wire according to the third preferred embodiment of this disclosure is shown. As shown in FIG. 4, after the insulating layer 3 is formed, and then a photoresist 4 is coated on the insulating layer 3.

Figure 5:
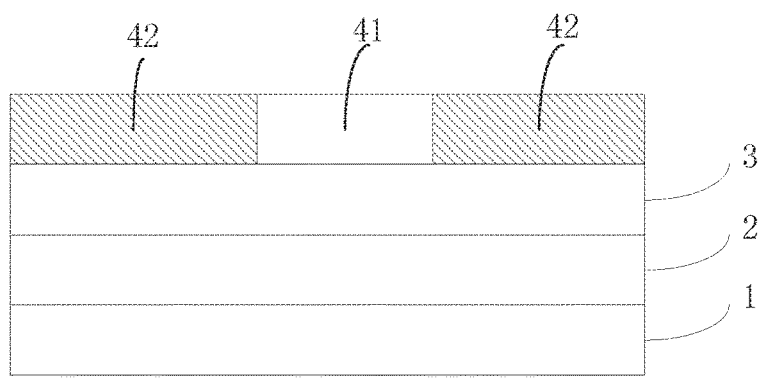
FIG. 5 is a structural schematic view of the array substrate in the process of the method for manufacturing the metal wire according to the fourth preferred embodiment of this disclosure.

Referring to FIG. 5, which is a structural schematic view of the array substrate in the process of the method for manufacturing the metal wire according to the fourth preferred embodiment of this disclosure is shown. As shown in FIG. 4 and FIG. 5, the photoresist is exposed by using a mask plate to form a photoresist retention region 41 and a photoresist non-retention region 42. Besides, the photoresist retention region 41 includes a region corresponding to a subsequently formed data line, and a region corresponding to a source and a drain. Furthermore, the photoresist retention region 41 is a region where exposure is not performed, the photoresist non-retention region 42 is a region for exposure.

Figure 6:
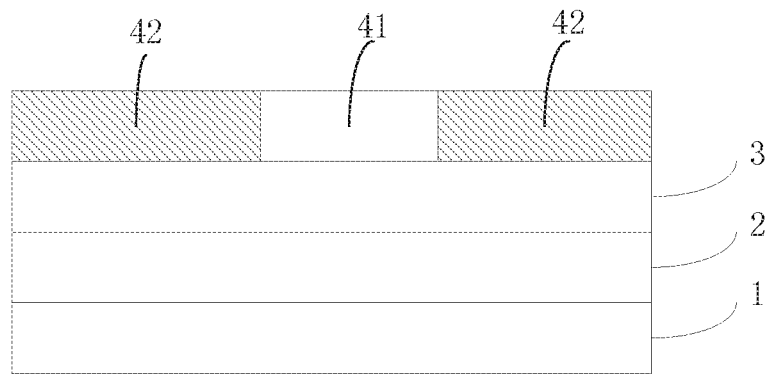
FIG. 6 is a structural schematic view of the array substrate in the process of the method for manufacturing the metal wire according to the fifth preferred embodiment of this disclosure.

Referring to FIG. 6, which is a structural schematic view of the array substrate in the process of the method for manufacturing the metal wire according to the fifth preferred embodiment of this disclosure is shown. As shown in FIG.

5 and FIG. 6, the photoresist non-retention region 42 is developed, and the photoresist non-retaining region 42 is removed to expose a region of the insulating layer 3 that needs to be etched. The insulating layer 3 is etched to remove portions of the insulating layer 3 not covered by the photoresist retention region 41 to expose a region of the source-drain metal layer 2 that needs to be etched. So that a remaining portion 31 of the insulating layer 3 on the source-drain metal layer 2 is only located in the photoresist retention region 41, the portion 31 is used for preventing the data line from being broken when the source-drain metal layer 2 is subsequently etched.

Figure 7:
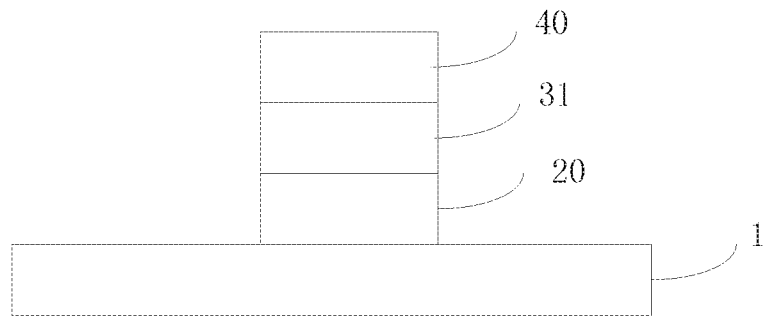
FIG. 7 is a structural schematic view of the array substrate in the process of the method for manufacturing the metal wire according to the sixth preferred embodiment of this disclosure.
Figure 8:
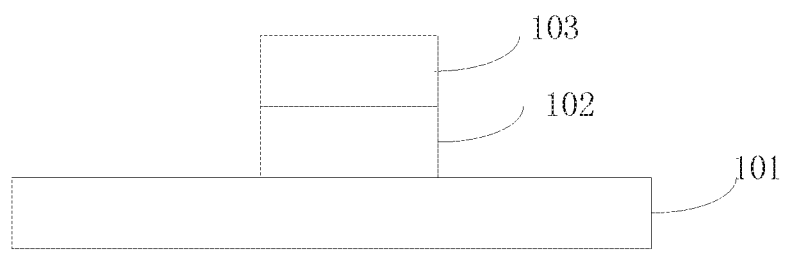
FIG. 8 is a structural schematic view of the array substrate according to the preferred embodiment of this disclosure.

Referring to FIG. 7, which is a structural schematic view of the array substrate in the process of the method for manufacturing the metal wire according to the sixth preferred embodiment of this disclosure is shown. In combination with FIG. 5 and FIG. 6, after the insulating layer 3 on the photoresist non-retention region 42 is etched, it can be seen at this time that the array substrate includes a gate insulating layer 1, a source-drain metal layer 2, and the portion 31 of the insulating layer on the photoresist retention region 41 and the portion 40 of the photoresist.

In combination with FIG. 4, FIG. 5, FIG. 6, and FIG. 7, the insulating layer 3 on the photoresist non-retention region 42 is etched. It should be noted that the photoresist 4 is deformed by the etching solution, and that causes a tilt during the etching process. However, at this time, an insulating layer 3 is provided under the photoresist 4. Even if the photoresist 4 is tilted, the protective action of the insulating layer 3 can be made so that the data line 20 located below the insulating layer 3 is not easily broken.

Furthermore, in this embodiment, the step of etching the metal layer on the photoresist non-retained region further comprises:

ashing the photoresist on the photoresist retained region to remove the photoresist on the photoresist retained region.

Preferably, oxygen is supplied in the step of ashing the photoresist on the photoresist retained region.

This disclosure in this embodiment relates to the method for manufacturing the metal wire and the array substrate. An insulating layer is formed between the metal layer and the photoresist so that the insulating layer has a good adhesion to the metal layer. Thus, when the metal layer is etched, the metal wire will not break due to the tilted photoresist. This can prevent the metal line from being broken while the width of the wire is reduced, thereby improving product yield.

This disclosure further provides a method for manufacturing an array substrate. The method comprises the method for manufacturing the metal wire according to the preferred embodiment of this disclosure and is not describe herein. Specifically, the method can be referred to the method for manufacturing the metal wire described above. The method for manufacturing the metal wire is part of the manufacturing process of the array substrate. The manufacturing method of the other parts of the array substrate, such as a common electrode, a pixel electrode, a gate wire, and the like are known to those skilled in the art according to the conventional technology, and are not described in detail herein.

This disclosure further provides an array substrate, which comprises a substrate 101 and a metal wire 102 disposed on the substrate 101. The metal wire 102 is covered with an insulating layer 103 to protect the metal wire 102 from corrosion.

It should be noted that the array substrate of the preferred embodiment is identical to the structure of the array substrate formed by the method for manufacturing the array substrate described above. The specific description can refer to the description described above.

This disclosure in this embodiment relates to the method for manufacturing the metal wire and the array substrate using the same. An insulating layer is formed between the metal layer and the photoresist so that the insulating layer has a good adhesion to the metal layer. Thus, when the metal layer is etched, the metal wire will not break due to the tilted photoresist. This can prevent the metal line from being broken while the width of the wire is reduced, thereby improving product yield.

This disclosure has been described with preferred embodiments thereof, and it is understood that many changes and modifications to the described embodiment can be carried out without departing from the scope and the spirit of the invention that is intended to be limited only by the appended claims.

What is claimed is:
1. A method for manufacturing a metal wire, comprising steps of:
forming a metal layer on a substrate;
forming an insulating layer on the metal layer;
coating a photoresist on the insulating layer;
exposing the photoresist to form a photoresist retention region and a photoresist non-retention region;
developing the photoresist non-retention region, and removing the photoresist non-retaining region to expose a region of the insulating layer to be etched;
etching the insulating layer to remove portions of the insulating layer not covered by the photoresist retention region to expose a region of the metal layer to be etched; and
etching the metal layer to remove portions of the metal layer not covered by the photoresist retention region to form a metal wire;
wherein the insulating layer is made of oxides, nitrides, or nitroxides; and
wherein the step of etching the metal layer on the photoresist non-retained region further comprises:
ashing the photoresist on the photoresist retained region to remove the photoresist on the photoresist retained region.

2. The method for manufacturing the metal wire according to claim 1, wherein the metal layer is a source-drain metal layer, and the photoresist retention region includes a region corresponding to a subsequently formed data line and a region corresponding to a source and a drain.

3. The method for manufacturing the metal wire according to claim 1, wherein the metal layer is a source-drain metal layer, and the photoresist retention region includes a region corresponding to a subsequently formed data line and a region corresponding to a source and a drain.

4. The method for manufacturing the metal wire according to claim 1, wherein oxygen is supplied in the step of ashing the photoresist on the photoresist retained region.

5. The method for manufacturing the metal wire according to claim 1, wherein the metal wire is a data line or a common electrode line.

6. A method for manufacturing a metal wire, comprising steps of:
forming a metal layer on a substrate;
forming an insulating layer on the metal layer;
coating a photoresist on the insulating layer;
exposing the photoresist to form a photoresist retention region and a photoresist non-retention region;

developing the photoresist non-retention region, and removing the photoresist non-retaining region to expose a region of the insulating layer to be etched;

etching the insulating layer to remove portions of the insulating layer not covered by the photoresist retention region to expose a region of the metal layer to be etched; and etching the metal layer to remove portions of the metal layer not covered by the photoresist retention region to form a metal wire.

7. The method for manufacturing the metal wire according to claim 6, wherein the insulating layer is made of oxides, nitrides, or nitroxides.

8. The method for manufacturing the metal wire according to claim 6, wherein the metal layer is a source-drain metal layer, and the photoresist retention region includes a region corresponding to a data line subsequently formed and a region corresponding to a source and a drain.

9. The method for manufacturing the metal wire according to claim 7, wherein the metal layer is a source-drain metal layer, and the photoresist retention region includes: a region corresponding to a subsequently formed data line, and a region corresponding to a source and a drain.

10. The method for manufacturing the metal wire according to claim 6, wherein the step of etching the metal layer on the photoresist non-retained region further comprises:

ashing the photoresist on the photoresist retained region to remove the photoresist on the photoresist retained region.

11. The method for manufacturing the metal wire according to claim 10, wherein oxygen is supplied in the step of ashing the photoresist on the photoresist retained region.

12. The method for manufacturing the metal wire according to claim 6, wherein the metal wire is a data line or a common electrode line.

* * * * *